(12) United States Patent
Hashimoto et al.

(10) Patent No.: US 10,808,312 B2
(45) Date of Patent: Oct. 20, 2020

(54) CHARGED PARTICLE DEVICE AND WIRING METHOD

(71) Applicant: HITACHI HIGH-TECH CORPORATION, Minato-ku, Tokyo (JP)

(72) Inventors: Yoichiro Hashimoto, Tokyo (JP); Eiko Nakazawa, Tokyo (JP); Mami Konomi, Tokyo (JP); Shuichi Takeuchi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 91 days.

(21) Appl. No.: 15/939,689

(22) Filed: Mar. 29, 2018

(65) Prior Publication Data

US 2018/0216223 A1 Aug. 2, 2018

Related U.S. Application Data

(62) Division of application No. 14/376,860, filed as application No. PCT/JP2013/052298 on Feb. 1, 2013, now Pat. No. 9,963,776.

(30) Foreign Application Priority Data

Feb. 6, 2012 (JP) .................................. 2012-22637

(51) Int. Cl.
*C23C 14/22* (2006.01)
*H01J 37/317* (2006.01)

(52) U.S. Cl.
CPC ........ *C23C 14/221* (2013.01); *H01J 37/3178* (2013.01); *H01J 2237/31732* (2013.01); *H01J 2237/31735* (2013.01)

(58) Field of Classification Search
CPC .. H01J 37/317; H01J 37/3174; H01J 37/3178; C23C 18/31; C23C 14/221; C23C 14/48; C23C 14/582
(Continued)

(56) References Cited

U.S. PATENT DOCUMENTS 5,191,213 A 3/1993 Ahmed et al.
7,880,144 B2 2/2011 Kuwabata et al.
(Continued)

FOREIGN PATENT DOCUMENTS

JP 02-205682 A 8/1990
JP 02205682 A * 8/1990
(Continued)

OTHER PUBLICATIONS

Office Action dated Nov. 6, 2017 for related German Application No. 11 2013 000 459.3.
(Continued)

*Primary Examiner* — Dah-Wei D. Yuan
*Assistant Examiner* — Nga Leung V Law
(74) *Attorney, Agent, or Firm* — Miles & Stockbridge, P.C.

(57) ABSTRACT

An object of the present invention is to provide: a wiring method in which wiring is performed in a vacuum chamber of a charged particle device without using gas deposition or the like; and a charged particle device.
In order to achieve the above-described object, the present invention proposes: a wiring method in which a wiring line composed of an ionic liquid is formed by dropping an ionic liquid on a sample or preparing an ionic liquid on a sample table, on which a sample is placed in advance, and irradiating a wiring track between a wiring start point and a wiring end point with a charged particle beam; and a charged particle device. According to this configuration, wiring can
(Continued)

be performed in a vacuum chamber of a charged particle device without using a gas deposition method or the like.

14 Claims, 16 Drawing Sheets

(58) Field of Classification Search
USPC .......................................... 427/551, 552, 596
See application file for complete search history.

(56) References Cited

U.S. PATENT DOCUMENTS

| | | |
|---|---|---|
| 2003/0000921 A1 | 1/2003 | Liang et al. |
| 2003/0222927 A1 | 12/2003 | Koyama |
| 2009/0173882 A1 | 7/2009 | Kuwabata et al. |
| 2011/0057100 A1 | 3/2011 | Nakazawa et al. |
| 2011/0181688 A1 | 7/2011 | Miyamoto et al. |
| 2011/0293847 A1* | 12/2011 | Hastings ............... G03F 7/2043 427/524 |
| 2012/0292507 A1 | 11/2012 | Morikawa et al. |

FOREIGN PATENT DOCUMENTS

| | | |
|---|---|---|
| JP | 2002-110680 A | 4/2002 |
| JP | 2006-335995 A | 12/2006 |
| JP | 2009-266741 A | 11/2009 |
| JP | 2011-124162 A | 6/2011 |
| JP | 2011-216426 A | 10/2011 |
| JP | 2011-1216426 A | 10/2011 |
| JP | 2012-083146 A | 4/2012 |
| JP | 2013-011540 A | 1/2013 |
| JP | 2013-096890 A | 5/2013 |
| WO | 2007/083756 A1 | 7/2007 |
| WO | 2011/074178 A1 | 6/2011 |

OTHER PUBLICATIONS

Office Action for related Japanese Application No. 2012-022637, dated Dec. 9, 2014.

* cited by examiner

[FIG. 1]
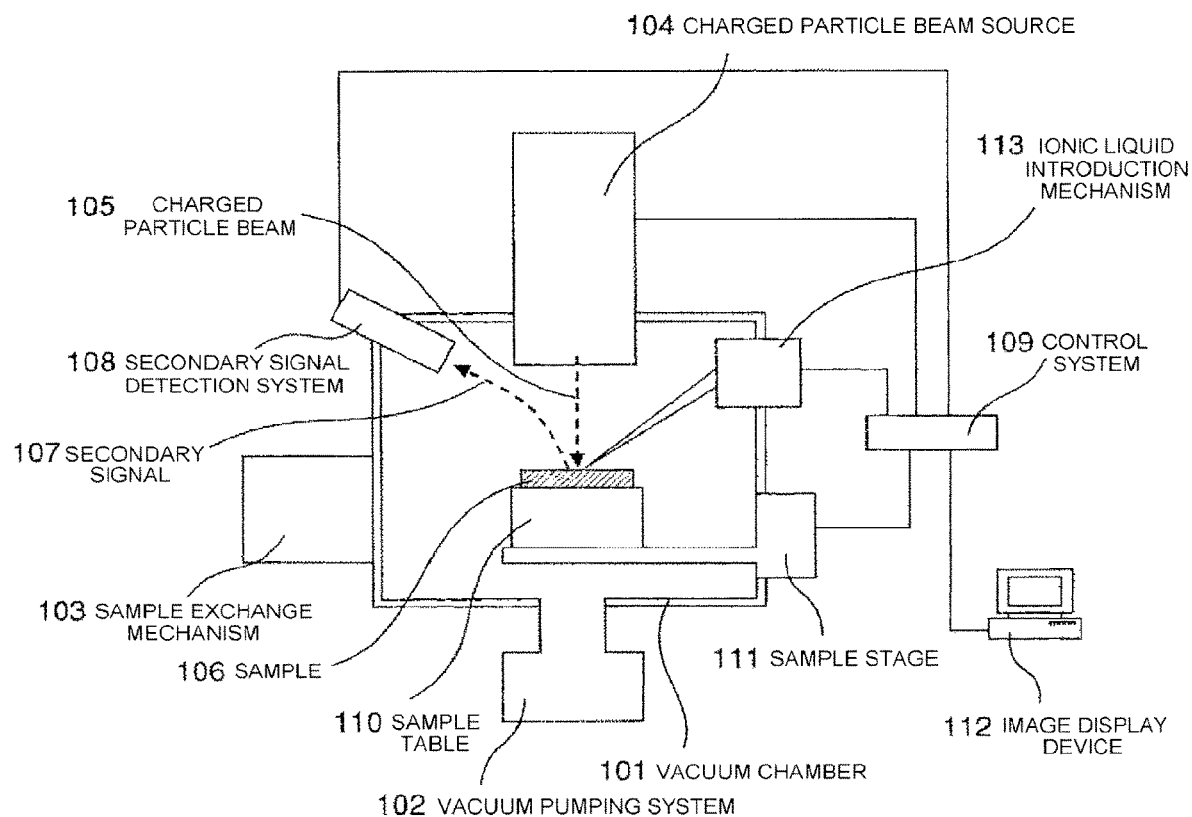

[FIG. 2]
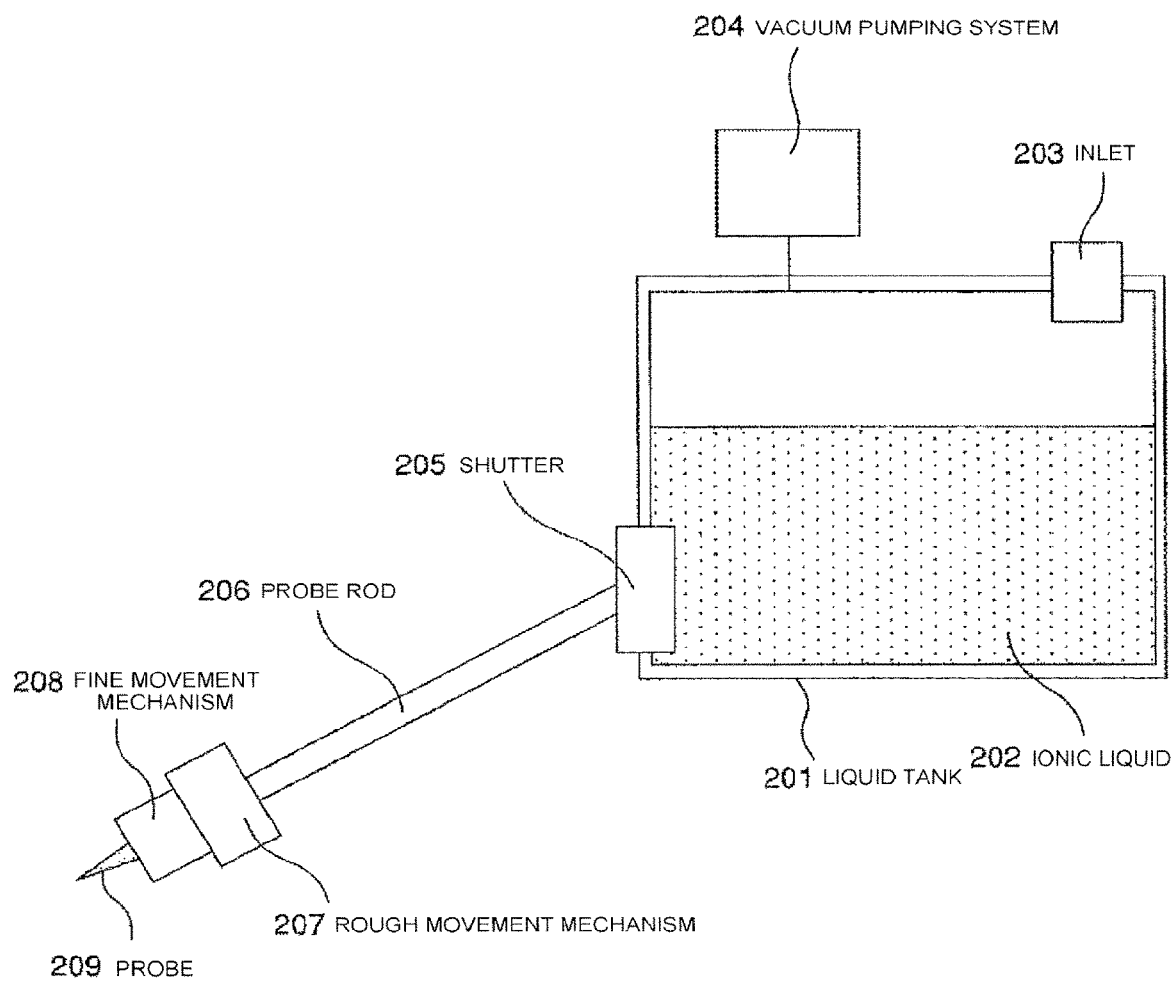

[FIG. 3]
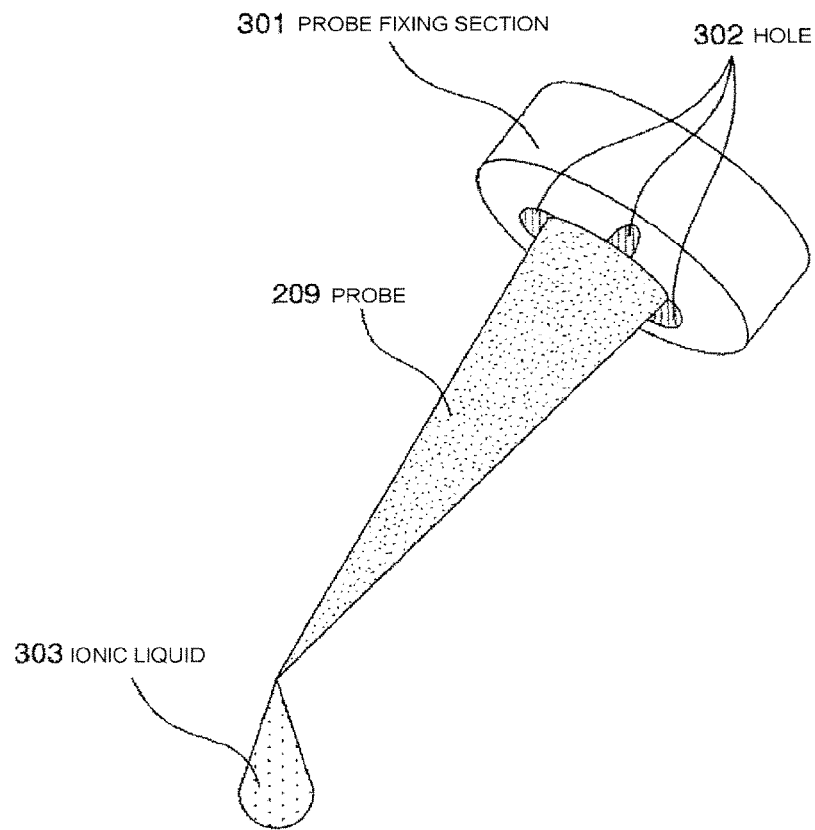
[FIG. 4]
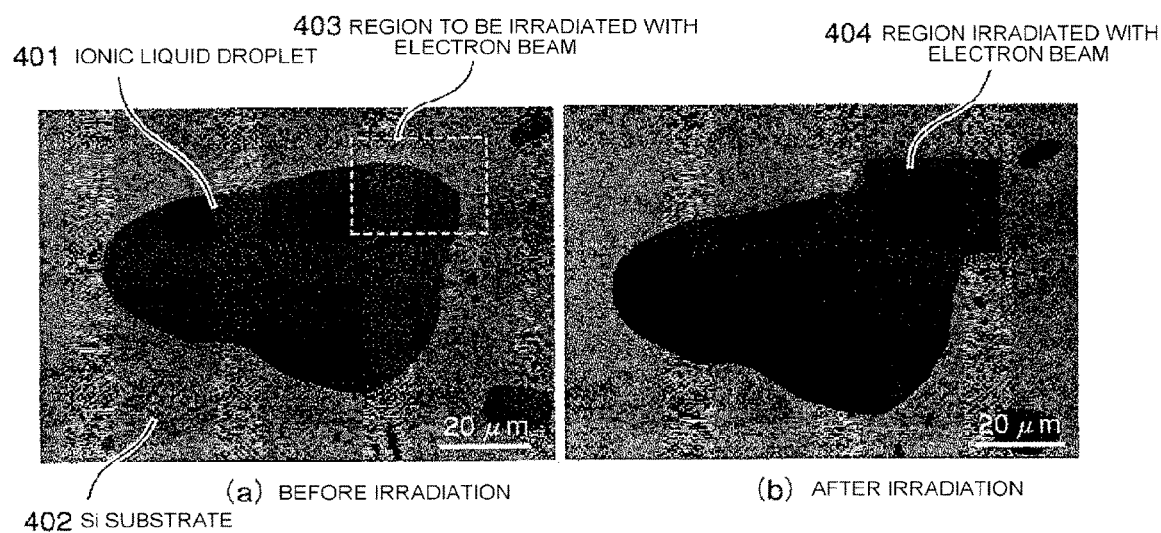
(a) BEFORE IRRADIATION  (b) AFTER IRRADIATION

[FIG. 5]
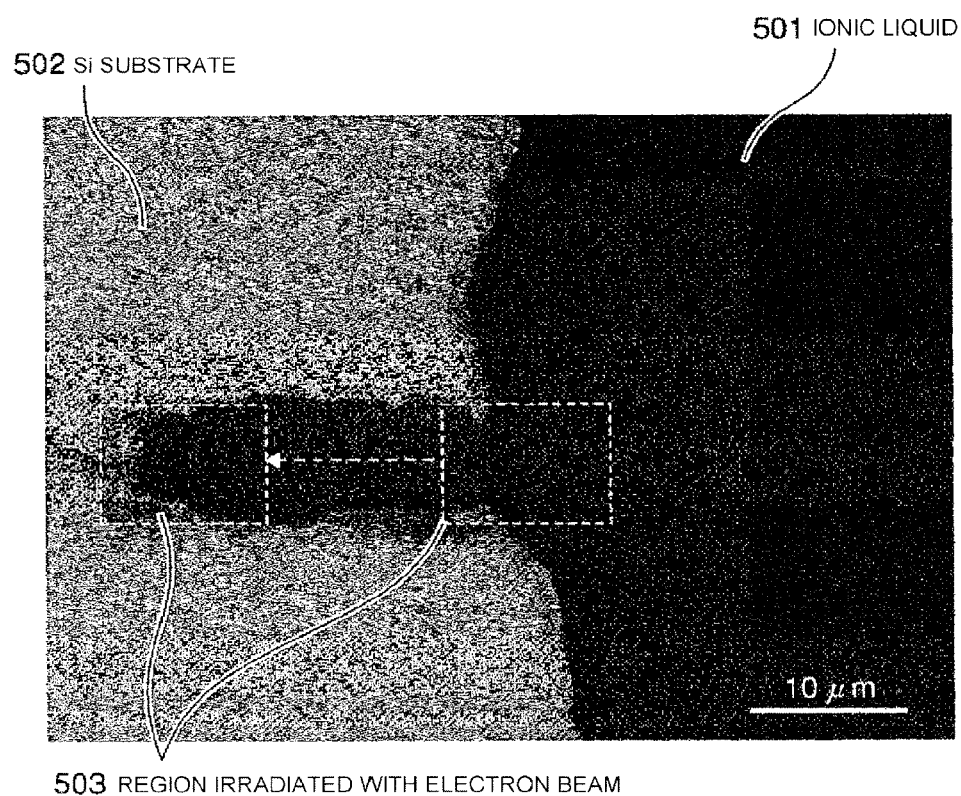

[FIG. 6]
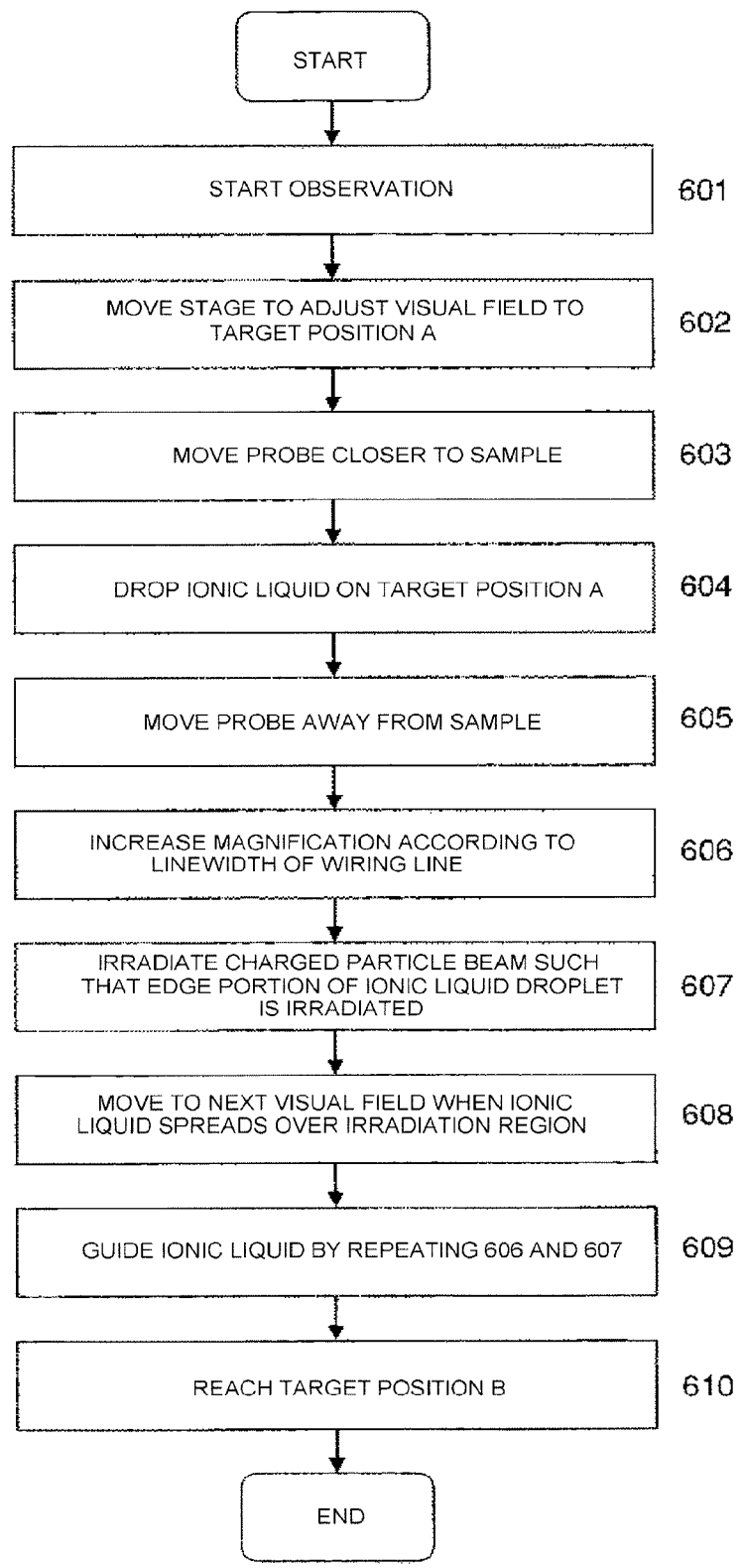

[FIG. 7]
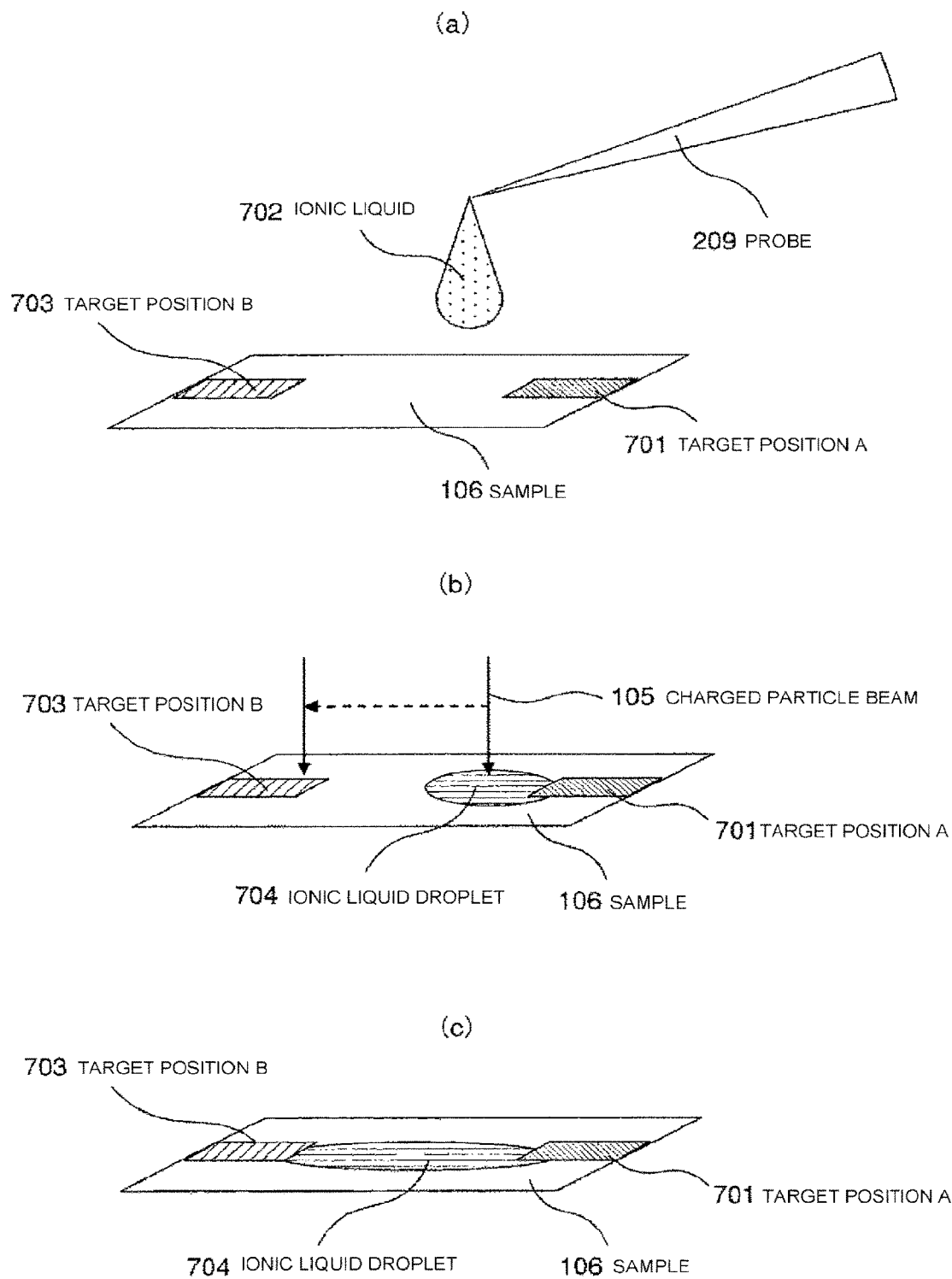

[FIG. 8]
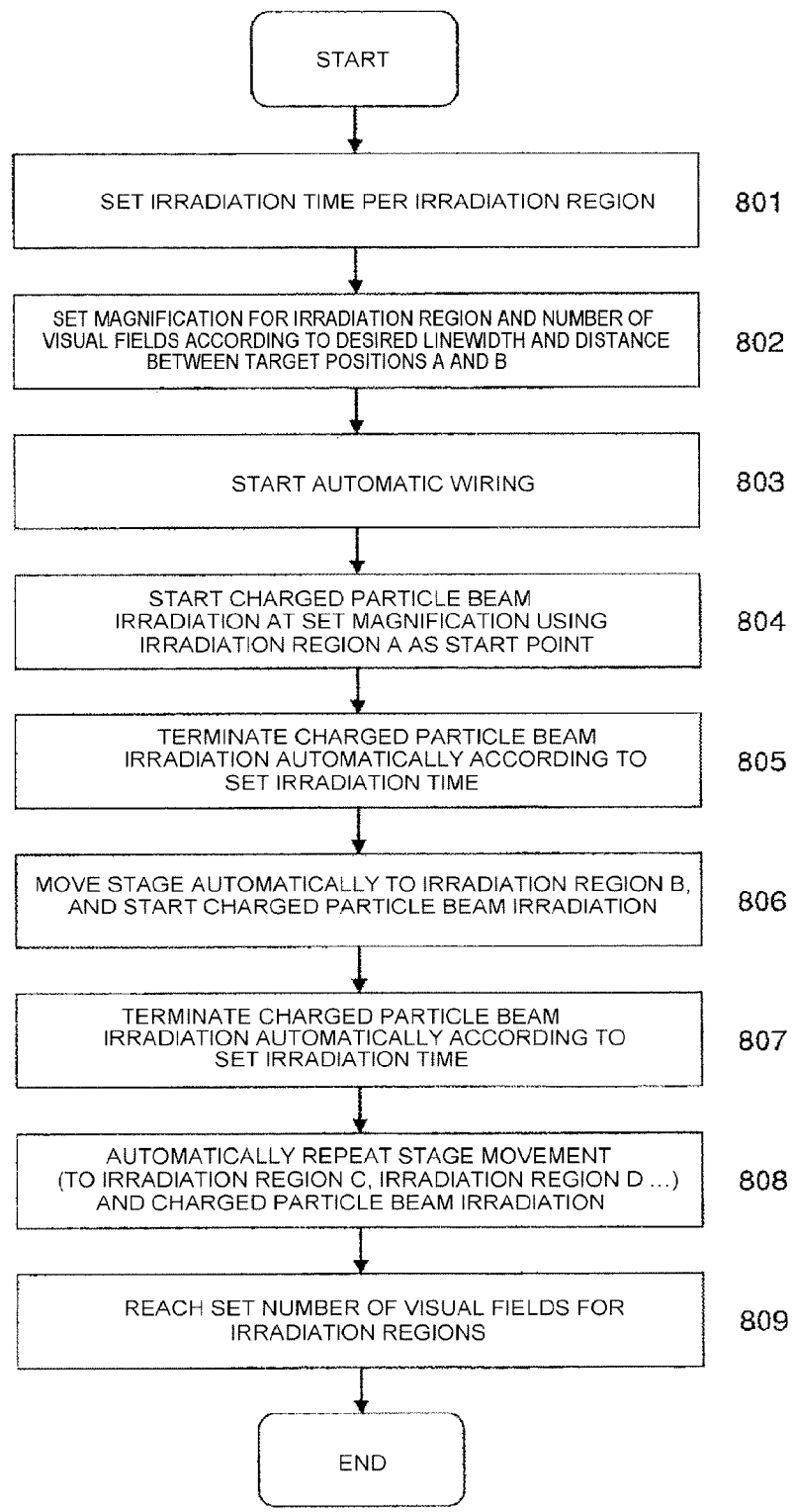

[FIG. 9]
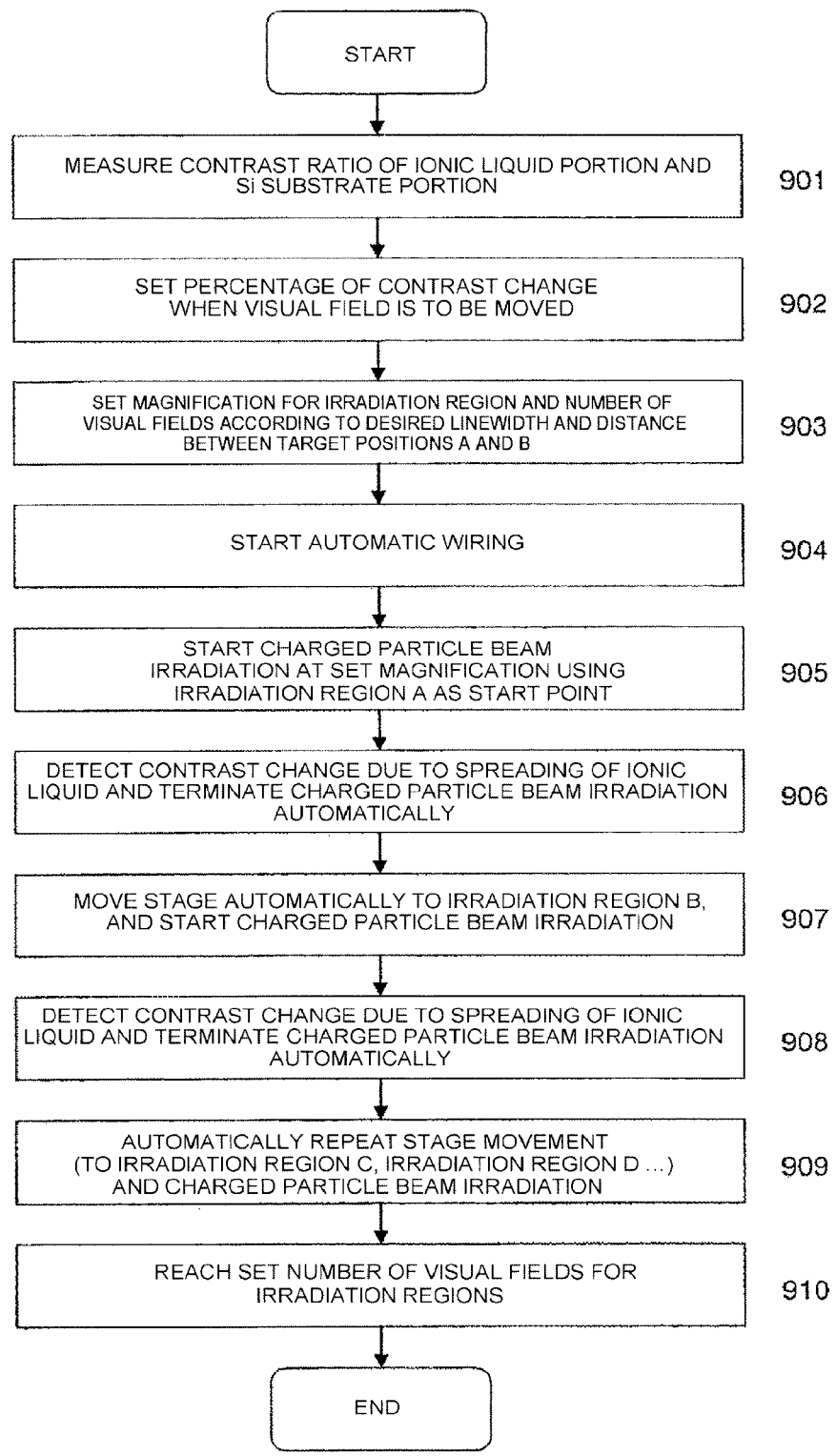

[FIG. 10]
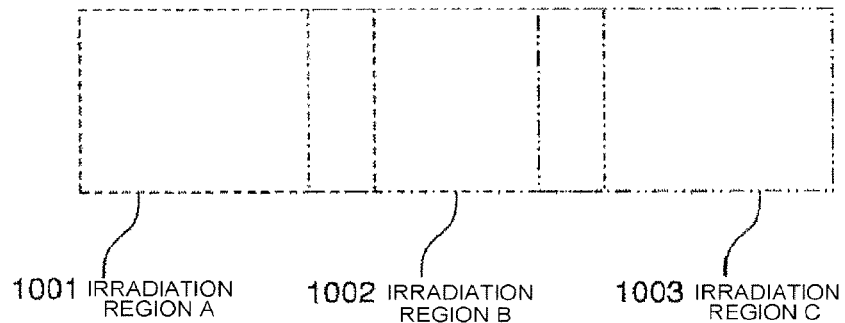
1001 IRRADIATION REGION A  1002 IRRADIATION REGION B  1003 IRRADIATION REGION C
[FIG. 11]
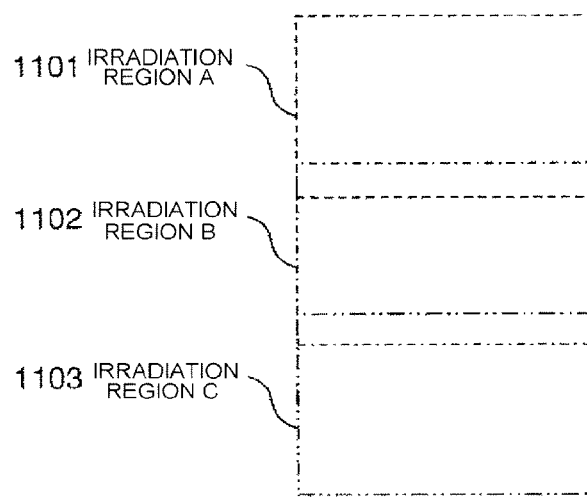
1101 IRRADIATION REGION A
1102 IRRADIATION REGION B
1103 IRRADIATION REGION C
[FIG. 12]
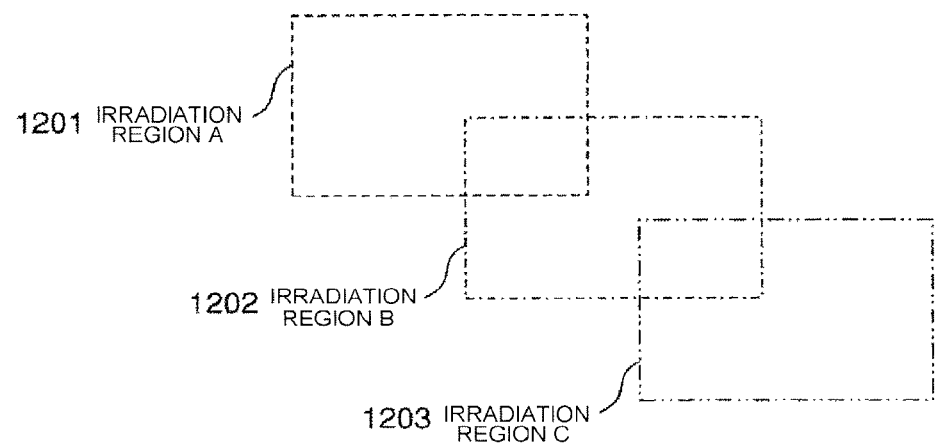
1201 IRRADIATION REGION A
1202 IRRADIATION REGION B
1203 IRRADIATION REGION C

[FIG. 13]
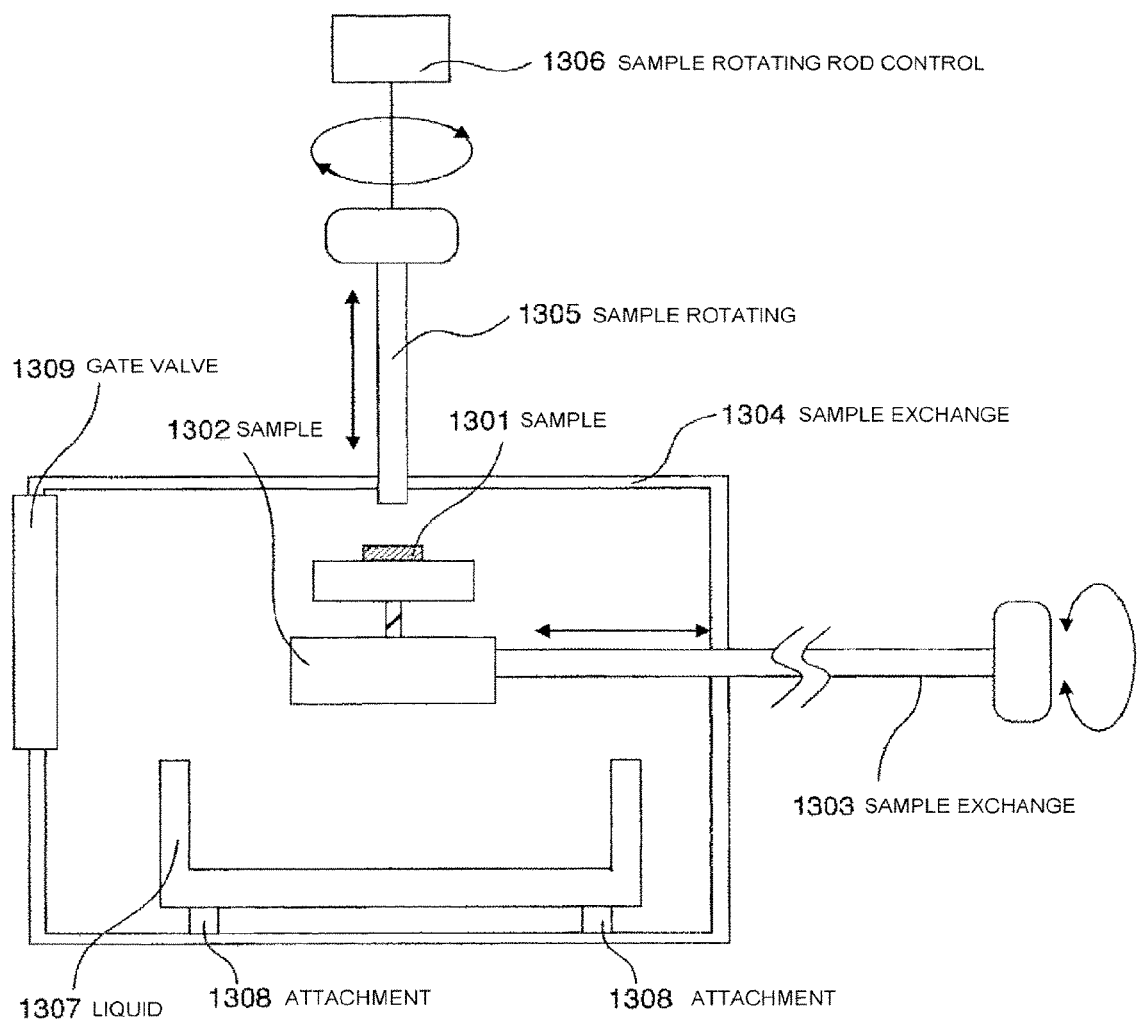

[FIG. 14]
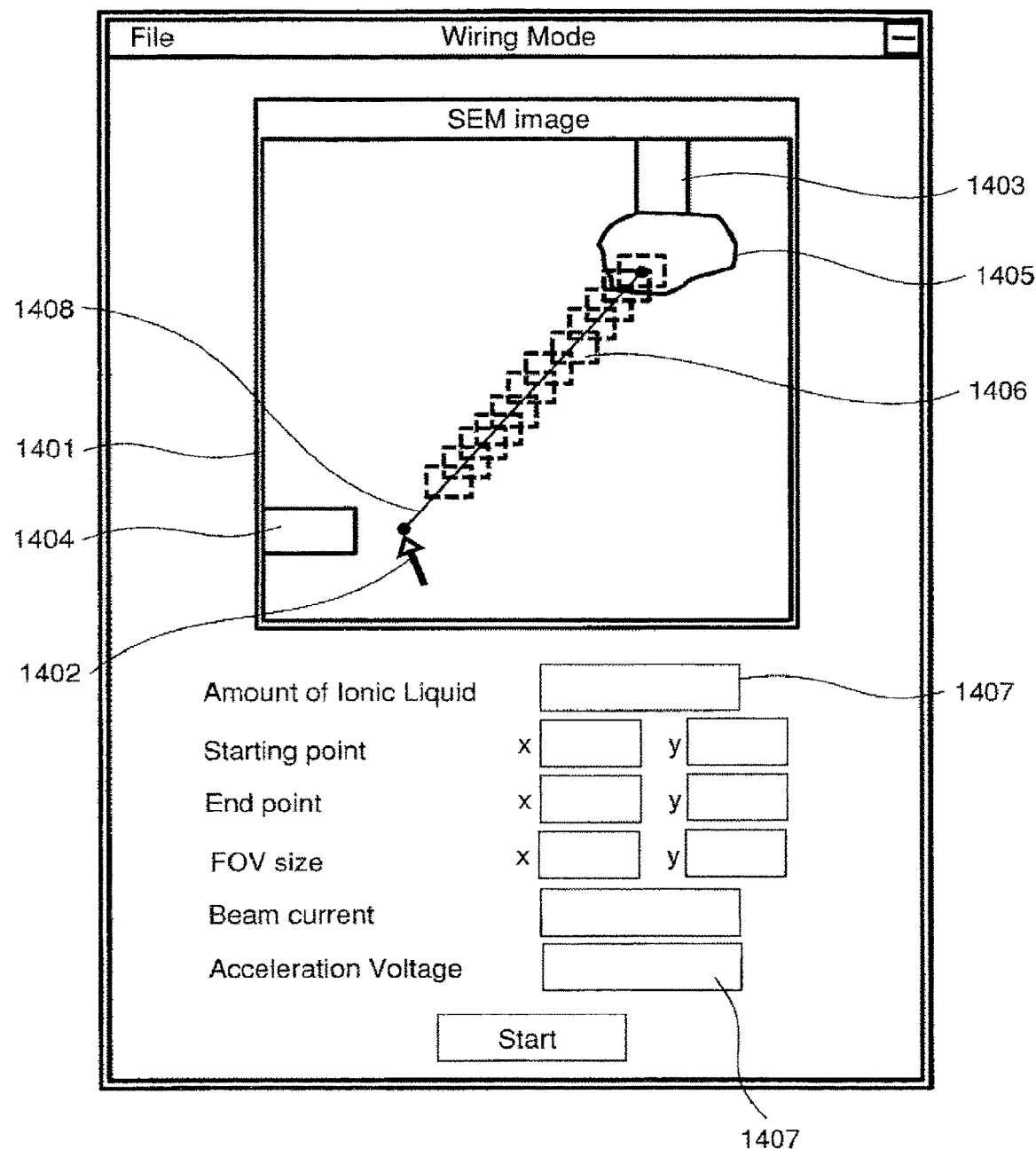

[FIG. 15]
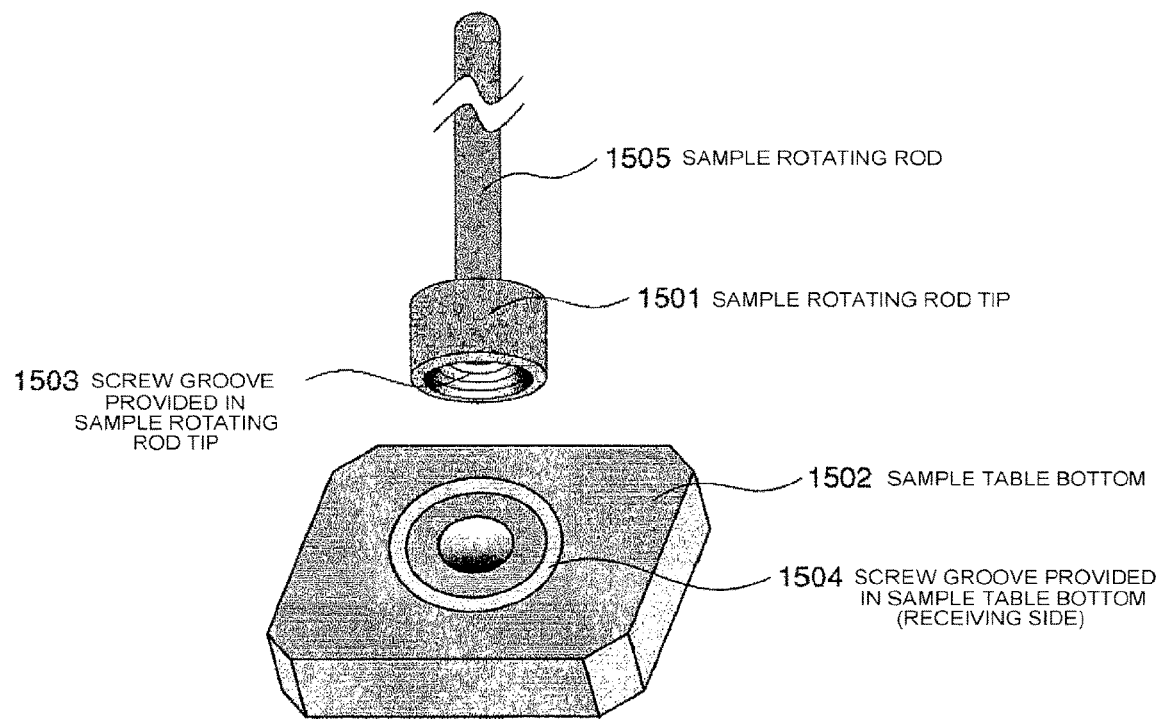

[FIG. 16]
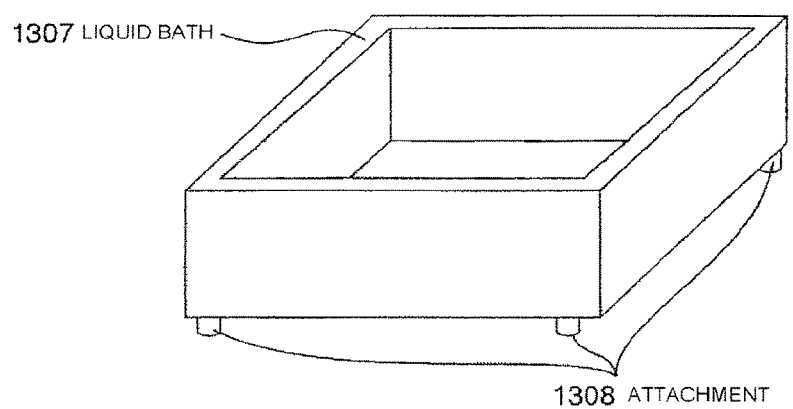
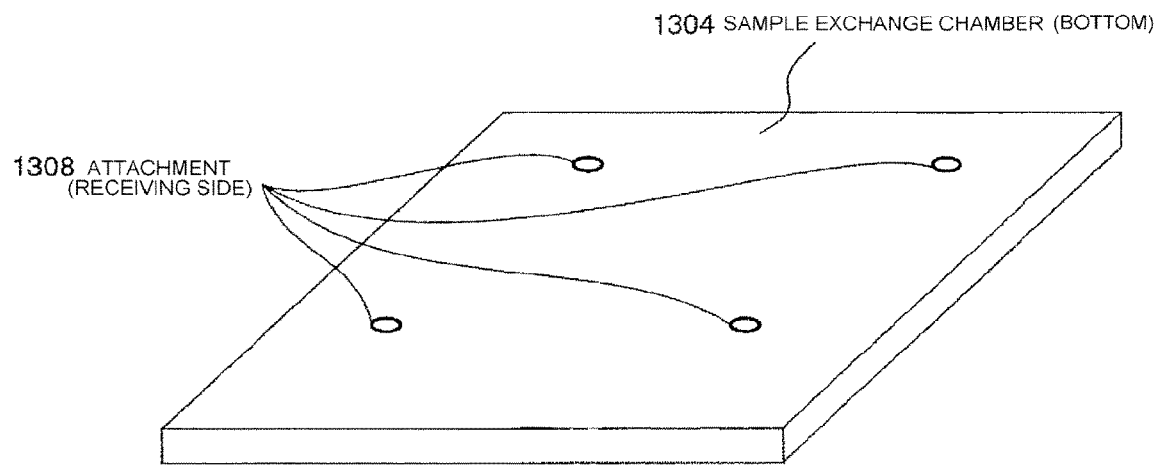

[FIG. 17]
(a)
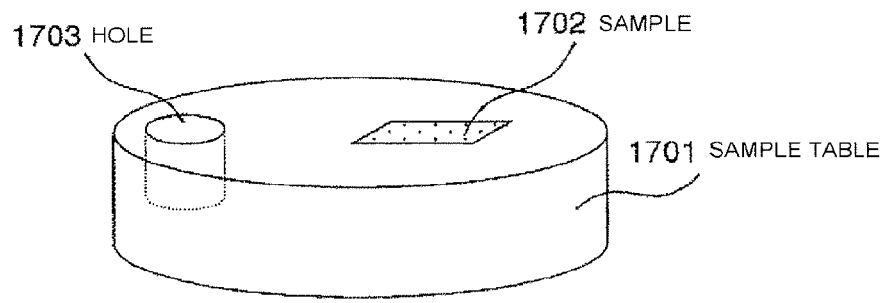
(b)
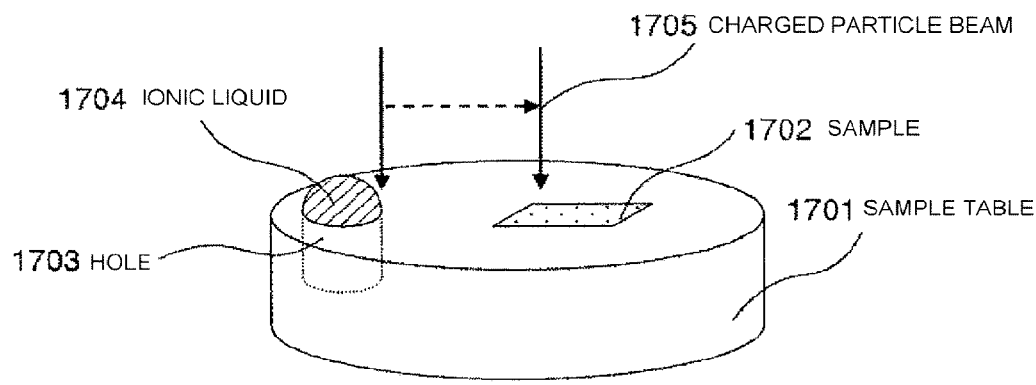
(c)
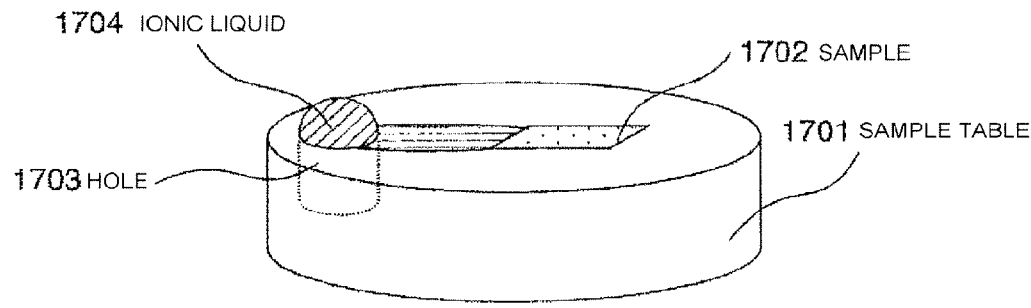

[FIG. 18]
(a)
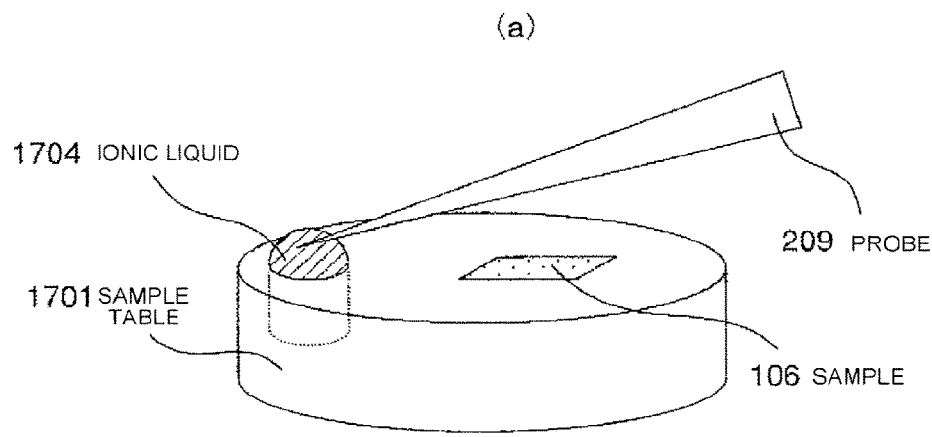
(b)
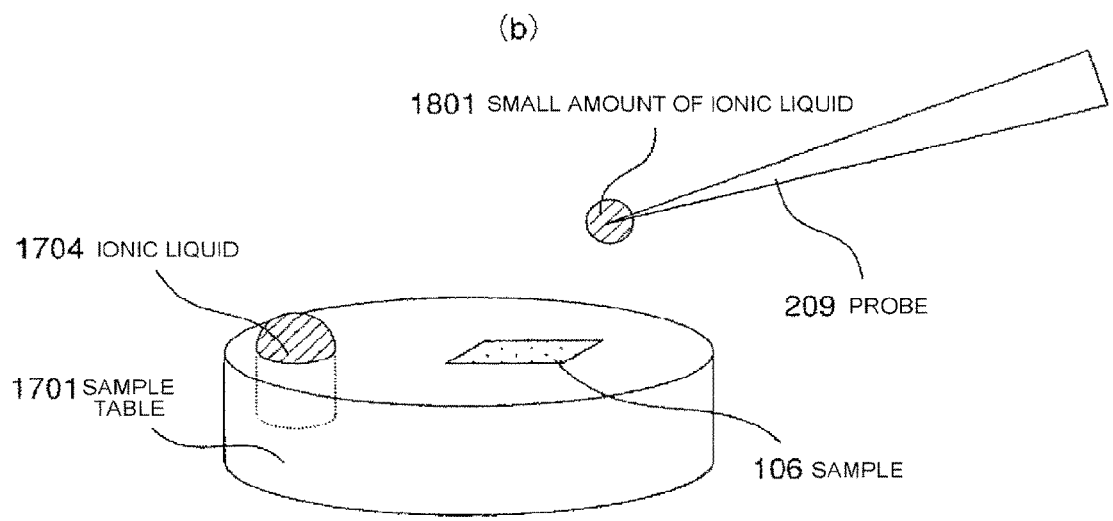
(c)
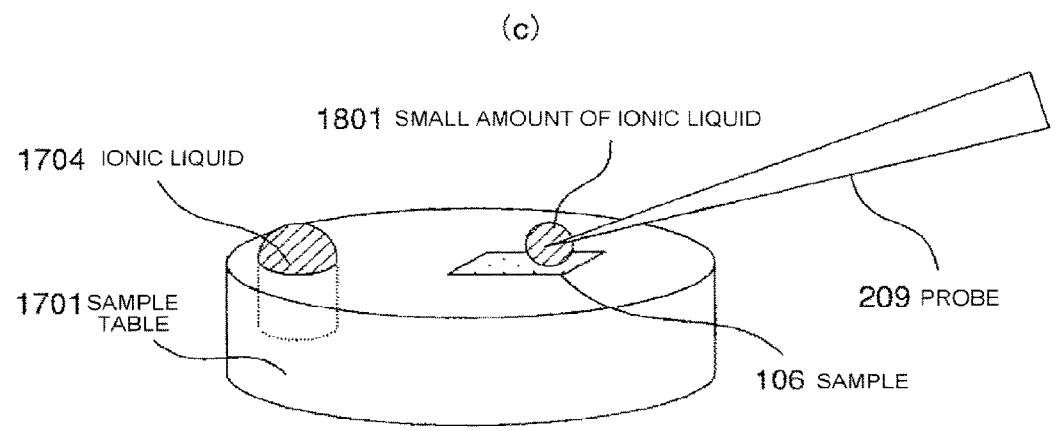

[FIG. 19]
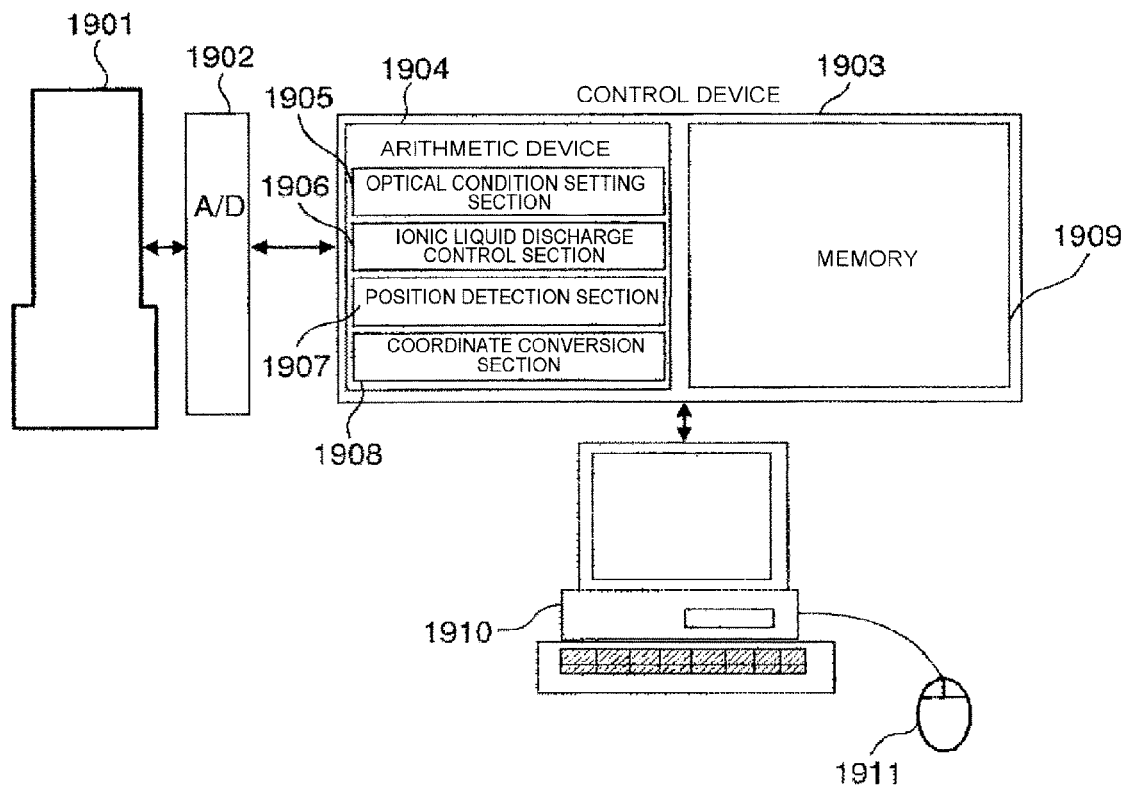
[FIG. 20]
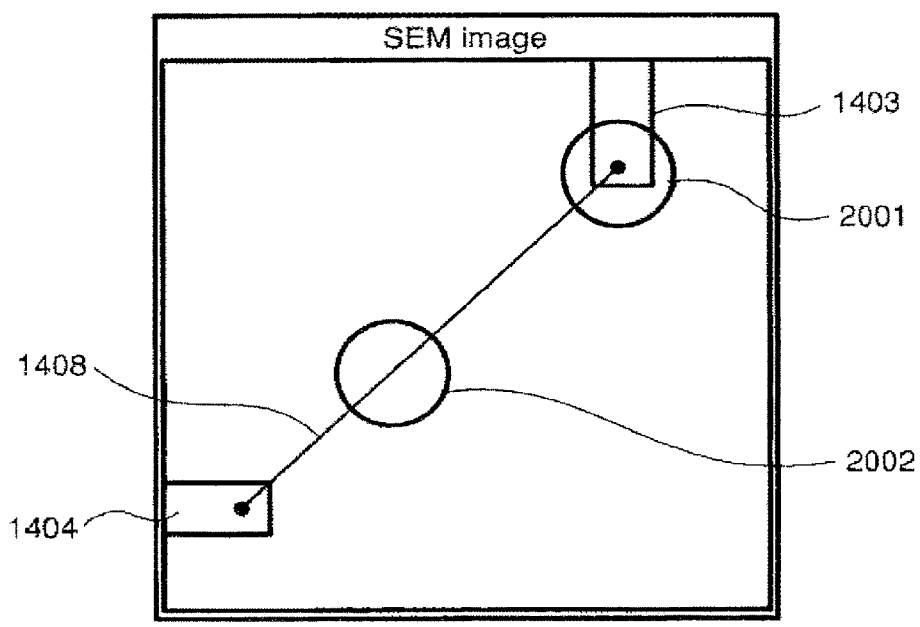

CHARGED PARTICLE DEVICE AND WIRING METHOD

TECHNICAL FIELD

The present invention relates to a charged particle device and a wiring method, more particularly relates to a wiring method using an ionic liquid, and a charged particle device including an ionic liquid source.

BACKGROUND ART

It has been demanded that a microregion on the nanoscale or microscale be observed using an electron microscope. As an observation method or a measurement method therefor, there are an observation method in which observation is made while applying a voltage to a microregion of a sample, a measurement method in which an absorbed electron current of a microregion is measured using an electron microscope, an observation method in which observation is made using an electron microscope in a state where a microregion is grounded, and the like.

In the case where observation or measurement as described above is made, local wiring is sometimes performed in a microregion so that local voltage application or local ground connection can be made.

As a method of performing local wiring, there is a gas deposition method using a focused ion beam as disclosed in PTL 4.

Further, PTL1 discloses a method of forming a conductive pattern by inkjet printing using an ink containing conductive particles and an ionic liquid. The ionic liquid has a characteristic that a liquid state is maintained even under vacuum conditions.

PTL 2 discloses a method of observing a biological sample in its original form by impregnating or applying an ionic liquid into or onto a water-containing sample so as to prevent the evaporation of water under vacuum conditions.

Further, PTL 3 discloses an observation method in which an ionic liquid is held in a sample holding member having an opening, and a sample is floated in the ionic liquid and observed.

CITATION LIST

Patent Literature

PTL 1: JP-A-2006-335995
PTL 2: WO2007/083756 (corresponding to U.S. Pat. No. 7,880,144)
PTL 3: JP-A-2009-266741 (corresponding to US Published Patent Application No. 2011/0057100)
PTL 4: JP-A-2002-110680

SUMMARY OF INVENTION

Technical Problem

In the case of a gas deposition method using an ion beam as disclosed in PTL 4, once wiring is performed, in order to remove the wiring line, it is necessary to scrape off the processed region by irradiating the region with an ion beam again for removing it, and therefore, there is a concern about damage at this time. Further, in the case of a method of forming a wiring line using inkjet printing as disclosed in PTL 1, it is necessary to perform wiring using a dedicated printing device, and therefore, wiring cannot be performed while making observation using an electron microscope or the like. Further, PTL 2 and PTL 3 do not disclose or suggest that wiring is performed in a local region of a sample.

Hereinafter, a wiring method for the purpose of performing wiring in a vacuum chamber of a charged particle device without using gas deposition or the like, and a charged particle device will be described.

Solution to Problem

As one embodiment for achieving the above-described object, hereinafter, a wiring method in which a wiring line composed of an ionic liquid is formed by dropping an ionic liquid on a sample or preparing an ionic liquid on a sample table, on which a sample is placed in advance, and irradiating a wiring track between a wiring start point and a wiring end point with a charged particle beam, and a charged particle device will be described.

Advantageous Effects of Invention

According to the above-described embodiment, it becomes possible to perform wiring in a vacuum chamber of a charged particle device without using a gas deposition method or the like.

BRIEF DESCRIPTION OF DRAWINGS

FIG. 1 is a structural view of a charged particle device.
FIG. 2 is a view showing one example of an ionic liquid introduction mechanism.
FIG. 3 is an enlarged view of a probe section of the ionic liquid introduction mechanism.
FIG. 4 is a view illustrating a phenomenon that an ionic liquid is moved by electron beam irradiation.
FIG. 5 is a view illustrating a phenomenon that the ionic liquid moves accompanying the movement of the irradiation position of an electron beam.
FIG. 6 is a flowchart showing the steps of a wiring method.
FIG. 7 is a view showing an outline of the steps of the wiring method.
FIG. 8 is a flowchart 1 showing the steps of an automatic wiring method.
FIG. 9 is a flowchart 2 showing the steps of the automatic wiring method.
FIG. 10 is a view showing a movement track of an electron beam irradiation region (horizontal direction).
FIG. 11 is a view showing a movement track of an electron beam irradiation region (vertical direction).
FIG. 12 is a view showing a movement track of an electron beam irradiation region (oblique direction).
FIG. 13 is a view showing one example of a sample exchange chamber.
FIG. 14 is a view showing one example of a GUI screen for setting wiring conditions.
FIG. 15 is a view showing one example of a sample rotating rod tip and a sample table bottom.
FIG. 16 is a view showing an external appearance of a liquid bath for the ionic liquid.
FIG. 17 is a view showing one example of a sample table on which the ionic liquid can be placed.
FIG. 18 is a view showing an ionic liquid supply method.
FIG. 19 is a view showing one example of a setting device which sets wiring conditions and a control device of an electron microscope.

FIG. 20 is a view showing one example of an SEM image when setting wiring conditions.

DESCRIPTION OF EMBODIMENTS

Hereinafter, a method in which in a charged particle device, a mechanism capable of introducing an ionic liquid into a sample chamber is disposed, an ionic liquid is dropped on a sample at an arbitrary position, and the dropped ionic liquid and/or a wiring track between a wiring start point and a wiring endpoint are/is irradiated with a charged particle beam to guide the ionic liquid to an arbitrary position, thereby moving the ionic liquid to another position, whereby arbitrary two positions are electrically wired, and the device will be described.

According to a method and a device described hereinbelow, a method and a device capable of forming and removing a wiring line in a microregion while suppressing damage to a sample can be realized.

First Embodiment

Hereinafter, a wiring method using an ionic liquid and a device will be described in detail with reference to the accompanying drawings.

FIG. 1 is a schematic view showing a structure of a charged particle device. Reference numeral 101 denotes a vacuum chamber, which can be maintained in a vacuum state by a vacuum pumping system 102. Reference numeral 103 denotes a sample exchange mechanism, which can introduce a sample to be observed into the device from the outside while maintaining the vacuum chamber 101 in a vacuum state. Reference numeral 104 denotes a charged particle beam source, which includes a cathode and an anode for generating a charged particle beam, and all the necessary optical systems such as a lens and an aperture for focusing the generated charged particle beam, and a scanning coil for scanning the charged particle beam. By the above-described optical systems in the charged particle beam source 104, a charged particle beam 105 can be focused on a sample 106, and scanned in an arbitrary order.

A secondary signal 107 generated on the surface of the sample 106 by the irradiation with the charged particle beam 105 is detected by a secondary signal detection system 108, and is input as image data to a control system 109 which also has an image arithmetic control function. The sample 106 is fixed on a sample table 110 with a conductive tape, paste, or the like, and can be moved in every three-dimensional direction by a sample stage 111.

The control system 109 also controls the charged particle beam source 104, the secondary signal detection system 108, the sample stage 111, an ionic liquid introduction mechanism 113, and an image display device 112. A signal detected by the secondary signal detection system. 108 is amplified by a signal amplifier in the control system 109, and thereafter transferred to an image memory, and displayed and recorded as a sample image in the image display device 112. Reference numeral 113 denotes the ionic liquid introduction mechanism, which can drop an ionic liquid on the sample 106 at an arbitrary position.

One example of the ionic liquid introduction mechanism 113 is shown in a schematic view in FIG. 2. Reference numeral 201 denotes a liquid tank, which can store an ionic liquid 202 to be dropped on the sample. Reference numeral 203 denotes an inlet, through which the ionic liquid 202 can be poured into the liquid tank 201. Further, to the inlet 203, a cap which can keep the inside of the liquid tank 201 airtight is attached. Reference numeral 204 denotes a vacuum pumping system, which can perform vacuum pumping in the liquid tank 201. Reference numeral 205 denotes a shutter, which separates the inside of the charged particle device from the liquid tank 201, and is closed when the pressure in the liquid tank 201 is atmospheric pressure so that the vacuum chamber 101 can be kept vacuum, and is opened when the inside of the liquid tank 201 is in a vacuum state so that the ionic liquid 202 can be allowed to flow out from the liquid tank 201. At this time, by adjusting the opening degree, the flow rate of the ionic liquid can be adjusted. Reference numeral 206 denotes a probe rod, which has a hollow space therein, and the inside of the hollow space is in a vacuum state or the ionic liquid flowing out from the liquid tank 201 can be allowed to flow therethrough. To the tip of the probe rod 206, a probe 209 is attached through a rough movement mechanism 207 using a mechanical structure and a fine movement mechanism 208 using a piezoelectric element, so that the probe 209 can be accurately moved closer to or away from the sample. The rough movement mechanism 207 and the fine movement mechanism 208 each have a hollow space therein in the same manner as the probe rod 206, and the ionic liquid flowing out from the liquid tank 201 and flowing through the probe rod 206 can be allowed to flow to the probe 209. The vacuum pumping system 204, the shutter 205, the rough movement mechanism 207, and the fine movement mechanism 208 are controlled by the control system 109 shown in FIG. 1. Further, a mechanism which generates a potential difference between the tip of the probe 209 and the sample table connected to the ground, and measures a current therebetween is provided, and the control of the mechanism is carried out using the control system 109.

FIG. 3 shows an enlarged view of the probe 209. The probe 209 is fixed to a probe fixing section 301, and can be freely removed and replaced. In the probe fixing section 301, a hole 302 is formed, and the ionic liquid flowing out from the liquid tank 201 and flowing through the probe rod 206, the rough movement mechanism 207, and the fine movement mechanism 208 can be allowed to flow along the surface of the probe 209. The ionic liquid 303 flowing along the surface of the probe 209 can be dropped on the surface of the sample 106 from the tip of the probe 209. A very shallow groove may be formed from the hole 302 to the tip of the probe 209 so as to make the ionic liquid flow smoothly to the tip. Further, in order to improve the wettability with respect to the ionic liquid, the roughness of the surface of the probe 209 may be adjusted.

According to the above-described configuration, by the charged particle device of this embodiment, the probe is moved closer to a sample to be observed and the ionic liquid can be dropped thereon while observing the surface of the sample. Further, after dropping the ionic liquid, the probe can also be moved away from the sample so as not to disturb the observation.

Second Embodiment

FIG. 4 shows secondary electron images of an ionic liquid droplet on a Si substrate observed using a scanning electron microscope: FIG. 4(a) shows a secondary electron image before irradiating the droplet with an electron beam; and FIG. 4(b) shows a secondary electron image after irradiating the droplet with an electron beam. In FIG. 4(a), a black region denoted by reference numeral 401 is an ionic liquid droplet, and the other region denoted by reference numeral 402 is a Si substrate. It was observed that when a region 403 to be irradiated with an electron beam is irradiated with an electron beam, the ionic liquid spreads over a region 404 irradiated with the electron beam as shown in FIG. 4(b). Further, FIG. 5 shows a secondary electron image observed after the ionic liquid droplet was irradiated with an electron beam while gradually moving the irradiation region away from the liquid droplet. In the same manner as in FIG. 4, a black region denoted by reference numeral 501 is an ionic liquid droplet, and the other region denoted by reference numeral 502 is a Si substrate. As a result of irradiating the region irradiated with an electron beam 503 with an electron beam while gradually moving the region in the direction of the arrow, it was observed that the ionic liquid moves as if it is attracted to the region irradiated with the electron beam. Based on the above results, it was found that the ionic liquid can be guided by electron beam irradiation.

This phenomenon is considered to be caused by the effect of a potential change due to the electron beam irradiation or by convection of the ionic liquid receiving the energy of the electron beam, and may be caused not only by an electron beam, but also by any charged particle beam. It is also considered that a potential change or convection is more likely to occur as the energy of electron beam or the amount of current is larger, and the guide speed is increased. However, when an excessively high energy or high amount of current is applied, the ionic liquid itself may be deteriorated to impair the fluidity. The energy of electron beam is preferably from about 1 to 30 kV, and the amount of current is preferably from about 1 to 50 pA.

Further, in the case where a sample is charged by beam irradiation, and the ionic liquid is attracted to the sample due to the charging, it becomes possible to guide the ionic liquid in a desired direction by irradiating not the ionic liquid itself but a track for guiding the ionic liquid (in the case where wiring is performed, a wiring track between a wiring start point and a wiring end point), which is positioned apart from the ionic liquid, with a beam as long as the track is within a range in which the electric field due to charging is exerted. However, if the beam irradiation position and the ionic liquid are separated too far, the electric field for guiding the ionic liquid may not be exerted on the ionic liquid. Therefore, for example, in the case where automatic processing is performed, it is preferred to set the processing conditions so that the distance between the beam irradiation position and the ionic liquid is not more than a predetermined value at which the influence of the electric field is considered to be exerted. On the other hand, if the beam irradiation regions are separated from each other, a disconnection may occur, and therefore, in light of the purpose of ensuring wiring connection, as illustrated in FIGS. 10 to 12, it is preferred to provide an overlapping portion between adjacent fields of view. Further, it is also possible to move the irradiation position while continuously performing beam irradiation.

FIG. 6 is a flowchart showing the steps of a wiring method. FIG. 7 is a schematic view illustrating the steps of the wiring method. A sample to be observed is inserted in a charged particle device, and observation is started (Step 601). Subsequently, a stage is moved to adjust a field of view to a target position A701 on the sample (Step 602). Subsequently, by using the rough movement mechanism and the fine movement mechanism described in the first embodiment, the probe 209 is moved closer to the sample 106 (Step 603). By using the probe 209, an ionic liquid 702 is dropped on the target position A701 (Step 604). The probe 209 is moved away from the sample 106 (Step 605). The magnification is increased according to a desired linewidth (Step 606). The field of view is adjusted so as to include an edge portion of the ionic liquid droplet 704, and a charged particle beam is irradiated (Step 607). When the ionic liquid spreads over a region irradiated with the charged particle beam, the field of view is moved to the next field of view. At this time, an overlapping portion is provided such that about 20 to 50% of the field of view overlaps with the previous field of view (Step 608). By repeating Step 607 and Step 608, the ionic liquid is guided (Step 609). When the ionic liquid reached a target position B703, the charged particle beam irradiation is terminated (Step 610). By the above-described steps, the target positions A and B are electrically wired to each other through the ionic liquid.

In this device, the above-described operation can be performed while making observation and wiring can be performed in a microregion on the nanoscale to microscale. Further, by using an electron beam as the charged particle beam 105, damage to a sample which is a matter of concern when adopting a method using gas deposition with a focused ion beam can be reduced.

Third Embodiment

The charged particle device described in this embodiment can automatically guide the ionic liquid by charged particle beam irradiation in the wiring method shown in the second embodiment. Here, an automatic wiring method will be described in two ways depending on how the timing of the movement of the field of view is controlled.

FIG. 8 is a flowchart showing the steps when the timing of the movement of the field of view is controlled according to time. First, the irradiation time per irradiation region is set (Step 801). Subsequently, the magnification for the irradiation region is determined according to a desired linewidth, and the number of fields of view is set according to the distance between the target positions A and B (Step 802). Automatic wiring is started (Step 803). By using the irradiation region A as a start point, the charged particle beam irradiation is automatically started at the set magnification (Step 804). The charged particle beam irradiation is automatically terminated according to the set irradiation time (Step 805). The stage is automatically moved to the irradiation region B, and the charged particle beam irradiation is automatically started again (Step 806). The charged particle beam irradiation is automatically terminated according to the set irradiation time (Step 807). The stage movement (to an irradiation region C, an irradiation region D and the charged particle beam irradiation are repeated automatically (Step 808). The set number of fields of view is reached (Step 809). By the above-described steps, the ionic liquid can be automatically guided by the charged particle beam irradiation by controlling the timing of the movement of the field of view according to time.

FIG. 9 is a flowchart showing the steps when the timing of the movement of the field of view is controlled according to a contrast change due to the spreading of the ionic liquid over the whole field of view. In the secondary electron images shown in FIGS. 4 and 5, the ionic liquid portion is observed with darker contrast as compared with the Si substrate, however, the contrast changes according to the type of the ionic liquid or the Si substrate. Therefore, first, the contrast ratio of the ionic liquid and the Si substrate is measured in each case (Step 901). Based on the contrast ratio measured in Step 901, setting is made as to what percentage of the field of view over which the ionic liquid spreads is reached when the field of view is to be moved (Step 902). The magnification for the irradiation region is determined according to a desired linewidth, and the number of fields of view is set according to the distance between the target positions A and B (Step 903). Automatic wiring is started (Step 904). By using the irradiation region A as a start point, the charged particle beam irradiation is automatically started at the set magnification (Step 905). The contrast change due to the spreading of the ionic liquid is detected, and the charged particle beam irradiation is automatically terminated according to the set percentage (Step 906). The stage is automatically moved to the irradiation region B, and the charged particle beam irradiation is automatically started again (Step 907). The contrast change due to the spreading of the ionic liquid is detected, and the charged particle beam irradiation is automatically terminated according to the set percentage (Step 908). The stage movement (to an irradiation region C, an irradiation region D . . . ) and the charged particle beam irradiation are repeated automatically (Step 909). The set number of fields of view is reached (Step 910). By the above-described steps, the ionic liquid can be automatically guided by the charged particle beam irradiation by controlling the timing of the movement of the field of view according to a contrast change due to the spreading of the ionic liquid over the whole field of view.

FIGS. 10 to 12 are schematic views showing the movement of the irradiation region in automatic wiring. FIG. 10 shows the case where the irradiation region is moved in the horizontal direction; FIG. 11 shows the case where the irradiation region is moved in the vertical direction; and FIG. 12 shows the case where the irradiation region is moved in the oblique direction. Reference numerals 1001, 1101, and 1201 each denote an irradiation region A, reference numerals 1002, 1102, and 1202 each denote an irradiation region B, and Reference numerals 1003, 1103, and 1203 each denote an irradiation region C. According to the number of fields of view set in Steps 802 and 903, an irradiation region D, an irradiation region E, and so on follow. As described above, an overlapping portion is provided between adjacent regions such as the irradiation regions A and B, and the irradiation regions B and C such that about 20 to 50% of the irradiation regions overlap with each other. In the flowcharts shown in FIGS. 8 and 9, the case where the irradiation region is moved in the direction from A to C is described, however, the irradiation region may be moved in the reverse direction. Further, the horizontal direction, the vertical direction, and the oblique direction may be combined, and wiring can be performed flexibly according to the situation. The magnification may be changed for each of the irradiation regions, and also the linewidth of the wiring line can be changed according to the situation.

By automating the above-described movement of the irradiation region under software control, wiring can be automatically performed. It is also possible to automate the movement in the horizontal direction and the vertical direction by using a continuous image capturing function provided for an SEM.

Fourth Embodiment

In this embodiment, the ionic liquid used for wiring can also be removed as needed. FIG. 13 is a schematic view showing the structure of the sample exchange mechanism 103 shown in FIG. 1. Reference numeral 1301 denotes a sample, which is fixed to a sample table 1302. The sample table 1302 having the sample 1301 fixed thereto is attached to the tip of a sample exchange rod 1303. By moving the sample exchange rod 1303 left or right, the sample can be moved in and out between a sample camber and a sample exchange chamber. Reference numeral 1304 denotes a sample exchange chamber, in which vacuum pumping is performed as a preliminary step for inserting the sample in the sample chamber. The tip of the sample exchange rod 1303 has a structure employing a banana clip system or a two-rod structure.

On the sample table 1302, a receiving section for receiving the sample exchange rod is provided. Further, the sample exchange rod 1303 can also rotate about its axis. Reference numeral 1305 denotes a sample rotating rod, which can move up and down. Further, it can be rotated about its axis by a sample rotating rod control section 1306.

FIG. 15 shows a schematic view showing the attachment of a sample rotating rod tip 1501 to a sample table bottom 1502. The sample rotating rod tip 1501 has a cylindrical shape and has a hollow space therein, and is processed to have a screw groove 1503 therein. In the sample table bottom (rear surface) 1502, a screw groove 1504 (receiving side) is provided, and the sample rotating rod tip can be attached to the sample table bottom.

At this time, the direction of tightening the screw and the direction of actually rotating the sample are the same, and therefore, even when the axis of the sample rotating rod 1305 rotates, the sample table bottom 1502 and the sample rotating rod tip 1501 are not detached from each other. When the sample table bottom 1502 and the sample rotating rod tip 1501 are detached from each other, by rotating the sample rotating rod 1305 in the loosening direction in a state where the sample exchange rod 1303 is attached, the sample rotating rod 1305 can be detached without rotating the sample table. It is a matter of course that the sample table does not fall down.

Reference numeral 1307 denotes a liquid bath, which plays a role in collecting the removed ionic liquid. Reference numeral 1308 denotes an attachment, which serves as a structure for attaching/detaching the liquid bath 1307 to/from the bottom of the sample exchange chamber. As shown in FIG. 16, a liquid bath bottom 1601 and the sample exchange chamber bottom 1602 are attached and fixed to each other by the attachments 1308. Reference numeral 1309 denotes a gate valve, which separates the sample exchange chamber from the sample chamber, and is opened and closed only when the sample table is moved in and out between the sample camber and the sample exchange chamber.

The sample exchange rod is rotated at 180 degrees (inverted), and the sample table is turned upside down. Subsequently, the sample rotating rod is attached to the screw groove on the bottom of the sample table, and the sample exchange rod is detached (withdrawn). By utilizing the vertically moving mechanism of the sample rotating rod, the sample table is lowered so that the surface of the sample is in the liquid bath. By utilizing the rotating mechanism of the sample rotating rod, the ionic liquid is thrown away by the centrifugal force. The rotating mechanism may be operated by either manual drive or automatic drive using a motor or the like.

The ionic liquid scattered at this time is adhered to the side walls of the liquid bath and collected in the liquid bath. By utilizing the vertically moving mechanism of the sample rotating rod, the sample table is raised, the sample exchange rod is attached, and the sample rotating rod is detached. The sample exchange rod is rotated about its axis, and the sample is turned upside down. The valve disposed between the sample chamber and the sample exchange chamber is opened, and the sample table is inserted in the sample chamber, and only the sample exchange rod is drawn out.

Then, the valve disposed between the sample chamber and the sample exchange chamber is closed, and the charged particle beam irradiation is performed in the charged particle device, and observation is made.

As a method of removing a local wiring line, a focused ion beam is used, however, a focused ion beam is used also for making observation, and therefore, there is a concern about damage to the sample during observation. In addition, the sample may be damaged also when a wiring line is scraped off by a focused ion beam. In the charged particle device of this embodiment, by using an electron beam as the charged particle beam, damage to the sample, which is a matter of concern when using a focused ion beam can be reduced, and a local wiring line can be removed.

Fifth Embodiment

In this embodiment, one example of the sample table on which the ionic liquid and the sample are placed will be described. A schematic view of the sample table is shown in FIG. 17. It does not matter whether the sample table 1701 is made of aluminum or carbon and has a stub shape, or is made of another conductive material and has another shape. The sample table 1701 is grounded through the sample stage 111 shown in FIG. 1. A sample 1702 fixed to the sample table 1701 is brought to such a state that it is not in electrically contact with the sample table such as a pattern on a glass substrate. When such a sample is irradiated with the charged particle beam, electric charges are accumulated on the surface of the sample, and in the case of electron microscopic observation, an effect such as image drift or abnormal contrast appears. A case where charging is suppressed by grounding such a sample will be described. On the surface of the sample table 1701, a hole 1703, which has a diameter of about 1 to 5 mm and a depth of about 1 to 5 mm, is present, and an ionic liquid 1704 is held therein in advance. The ionic liquid 1704 held therein is irradiated with a charged particle beam 1705, and guided and moved to a target position of the sample. According to the above-described configuration, the sample 1702 is grounded through the ionic liquid 1704 and the sample table 1701, and thus can be prevented from being affected by charging as described above.

Sixth Embodiment

In this embodiment, a case where an ionic liquid introduction mechanism is provided above the sample table 1701 shown in the fifth embodiment will be described. In the same manner as the fifth embodiment, on the surface of the sample table 1701, a hole 1703, which has a diameter of about 1 to 5 mm and a depth of about 1 to 5 mm, is present, and an ionic liquid 1704 is held therein in advance. A probe 209 is moved and brought into contact with the ionic liquid 1704 held in the hole 1703 to adhere a small amount of the ionic liquid 1801 to the tip of the probe. Thereafter, the probe 209 is moved, and the ionic liquid 1801 is adhered to a target position of the sample. By the above-described method, the liquid tank 201 in the ionic liquid introduction mechanism in the first embodiment is no longer needed, and the ionic liquid can be guided to the sample without adjusting the flow rate of the ionic liquid or the like.

Seventh Embodiment

When an insulating sample is observed using an electron microscope, in order to prevent the sample from being charged, after the sample is subjected to a conductivity imparting treatment such as metal coating, observation is made. However, metal particles are observed at a high magnification, and therefore, in the case where faithful observation of the sample structure is desired to be made, such a treatment is not suitable. When observation is made without performing metal coating, some effort is needed in some cases, for example, a condition where electric charges are easily discharged is provided by applying a conductive paste to the vicinity of the observation position in addition to the suppression of charging by adjusting the energy of electron beam, the amount of current, or the like. For example, in the case of a pattern on a glass substrate or the like, when the pattern present at the observation position continues to a distance on the millimeter order, a conductive paste is applied to the end of the pattern to make ground connection, whereby charging can be suppressed. However, in the case of a pattern in which the observation position is isolated, it is difficult to make local ground connection using a conductive paste. Therefore, by using a wiring method described in the first embodiment, the ionic liquid is guided to the vicinity of the observation position from a grounded position, for example, the ionic liquid is guided such that the ionic liquid surrounds the observation position, whereby electric charges are easily discharged to suppress charging, and thus, observation can be made.

Eighth Embodiment

As an observation method using an electron microscope, there is a method of measuring an absorbed electron current of a sample. Further, as the application of the method, for example, the measurement of an electron beam-induced current in a PN junction in a solar cell and the like can be performed. However, the miniaturization and complication of recent electronic devices have been advanced, and therefore, microwiring is needed in many cases, and there are cases where wiring is difficult when using a solder or a conductive paste.

By using the wiring method as described above, local wiring can be performed, and an absorbed electron current can be measured, and therefore, the above-described problem can be solved.

Further, as described in the first embodiment, the ionic liquid introduction mechanism has a mechanism to generate a potential difference between the tip of the probe 209 and the sample table connected to the ground, or to measure an electric current. Therefore, it is possible to perform the measurement of an electron beam-induced current as described above and the like by bringing the tip of the probe 209 into contact with an electrode portion or a place wired from the electrode portion. Further, by disposing a plurality of ionic liquid introduction mechanisms, voltage-current characteristics between the respective probes can be measured and more complicated electrical characteristic measurement such as a two-terminal method or a four-terminal method can be performed. By the combination use with the wiring using the ionic liquid, flexible measurement according to the situation can be performed.

Ninth Embodiment

As an observation method using an electron microscope, there is a need that observation is desired to be made while applying a voltage, for example, observation is made in a state where a voltage contrast is generated in a laminate structure by applying a voltage between electrodes for the purpose of evaluating characteristics or analyzing failures of a ceramic capacitor or the like. However, in the case of performing local evaluation, microwiring is needed, but there are cases where such wiring is difficult when using a solder or a conductive paste. By using the wiring method as described above, local wiring can be performed, and therefore, a voltage can be applied locally, as a result, the above-described problem can be solved.

Further, it is also possible to use the absorbed electron current measurement described in the eighth embodiment and the voltage application in combination. Further, when a plurality of ionic liquid introduction mechanisms are disposed, a voltage can be applied not only between the sample table and the probe, but also between the respective probes.

Tenth Embodiment

With respect to an electron microscope, for example, there is a need that observation is desired to be made while heating or cooling a sample for the purpose of evaluating thermal characteristics of a metal, a crystalline material, or the like. An ionic liquid generally has favorable thermal conductivity and is said to be applicable not only as an electrically conductive medium but also as a thermally conductive medium. Further, an ionic liquid stably takes a liquid state in a wide temperature range (from about −50° C. to 300° C.), and therefore can be heated to about 300° C. and cooled to about −50° C. In the case where heating or cooling is performed using a conventional device, the whole sample is heated or cooled. However, for example, in the case where a sample is surrounded by a thermally weak material and only a thermally strong portion of the sample is desired to be heated, local heating is needed. In the charged particle device of the present invention, the ionic liquid can be used not only as an electrically conductive wiring line, but also as a thermally conductive wiring line, and therefore, local heating or cooling can be performed, as a result, the above-described problem can be solved.

Eleventh Embodiment

FIG. 14 is a view showing one example of a GUI (Graphical User Interface) screen for setting conditions for wiring using an ionic liquid. FIG. 19 is a view showing one example of a wiring system provided with an input device 1910 having a display device which displays the GUI screen illustrated in FIG. 14, and a control device 1903 which generates a signal for controlling a scanning electron microscope main body 1901 based on the wiring conditions set in the input device 1910. Between the scanning electron microscope main body 1901 and the control device 1903, an A/D converter 1902 for performing analog/digital conversion of signals is connected. Further, a pointing device 1911 capable of setting an arbitrary position on the GUI screen is connected to the input device 1910.

On the GUI screen illustrated in FIG. 14, a display region 1401 in which an SEM image is displayed and a processing condition input window 1407 are provided.

The processing condition input window 1407 is provided for inputting device parameters required for wiring, for example, the supply amount of the ionic liquid (Amount of Ionic Liquid), the wiring start point (Starting Point), the wiring end point (End Point), the size of the beam irradiation region (FOV (Field Of View) Size), the electron beam current (Beam Current), and the electron beam acceleration voltage (Acceleration Voltage). Further, along with the input to the processing condition input window 1407 or in place of the input to the processing condition input window 1407, the processing conditions can be input to the display region 1401.

In the SEM image illustrated in FIG. 14, two wiring lines 1403 and 1404 are displayed, and this embodiment will be described by taking a process of connection between these two wiring lines as an example. First, the drop position of the ionic liquid and the amount of the ionic liquid are executed based on the input of "Amount of Ionic Liquid" and "Starting Point". Incidentally, as for the amount of the ionic liquid, if there is a specified amount stored in advance, the ionic liquid may be dropped based on the specified amount, and as for the drop position, the position may be set using a pointer 1402. Based on the setting in such a manner, an ionic liquid discharge control section 1906 included in the control device 1903 illustrated in FIG. 19 generates a signal for controlling the positions of the probe 209 and the sample stage 111 so that the ionic liquid 1405 can be discharged at the specified position. Further, the ionic liquid introduction mechanism 113 is controlled so that the specified amount of the ionic liquid can be discharged. In the case where the drop position is set using the pointer 1402, a position detection section 1907 recognizes the specified position in the display region 1401, and a coordinate conversion section 1908 converts the specified position to a stage coordinate or a control signal for the ionic liquid discharge control mechanism 1906 and generates a control signal.

In addition to the input described above, by inputting "End Point", the processing start point and the processing end point can be determined, and therefore, an optical condition setting section 1905 may set a moving track 1408 of the irradiation position such that both points are connected to each other, or may set an arbitrary track using the pointer 1402. Based on the above-described setting, the optical condition setting section 1905 generates a deflection signal for a deflector (not shown) for moving the beam irradiation position from the processing start point to the processing end point as time passes, or a control signal for the sample stage 111. By providing such an irradiation region moving unit, the wiring can be automatically performed. In a memory 1909, the generation conditions for control signals based on the input conditions are stored in advance, and based on the generation conditions, a control signal is generated. Incidentally, the thickness of the wiring line is determined according to the size of the beam irradiation region 1406, and therefore can be determined by the input of "FOV size". The optical condition setting section 1905 generates a scanning signal for a scanning deflector (not shown) by setting the "FOV size".

Incidentally, if the processing start point, the processing end point, and the "FOV size" are determined, the size of the region to which the ionic liquid is to be applied can be determined. Therefore, a table for storing the size of the region and the amount of the ionic liquid in association with each other, or a relational formula thereof is registered in the memory 1909 in advance, and the discharge amount of the ionic liquid may be automatically determined by setting the processing start point, the processing end point, and the "FOV size". Further, if a large amount of the ionic liquid is discharged at one position, in the case of a sample in which a distance between adjacent patterns is small, the adjacent patterns may be electrically connected to each other. Accordingly, as illustrated in FIG. 20, it is desirable that the size of an ionic liquid discharge region 2001 can be set arbitrarily. In this case, a table showing the relationship between the size of the discharge region and the discharge amount or a relational formula thereof is stored in the memory 1909 in advance, and based on the table or the relational formula, the discharge amount may be automatically determined.

Further, in the case where a discharge amount (D1) determined according to the processing start position, the processing end position, and the "FOV size" and a discharge amount (D2) determined according to the size of the ionic liquid discharge region 2001 satisfy the following relationship: D1>D2, the ionic liquid required for wiring is insufficient, and therefore, for example, as illustrated in FIG. 20, a new ionic liquid discharge region 2002 may be provided to ensure the necessary amount. In the case where the ionic liquid discharge region 2001 is used as the processing start point and the processing proceeds, the processing passes through the ionic liquid discharge region 2002 before the processing reaches the processing end point, and therefore, it becomes possible to continue the processing by using the ionic liquid discharge region 2002 as a new processing start point (ionic liquid replenishment point).

On the GUI screen illustrated in FIG. 14, after the processing conditions as described above are set, by pressing a start button (Start), the processing can be started. Further, if the moving speed of the irradiation position is too fast, the wiring line may be disconnected, and therefore, a configuration in which the moving speed of the beam irradiation position can be controlled may be adopted. Further, the control may be performed such that scanning of a sample region displayed in the display region 1401 and scanning of the beam irradiation region 1406 (narrow range scanning) are continuously switched to each other so that the process of the wiring can be confirmed by visual observation. According to such control, it becomes possible to confirm the process of the wiring by an animated image. Further, as illustrated in FIG. 14, by enabling the set region of the beam irradiation region 1406 to be visually observed, it becomes possible to visually compare the set processing region and the actual processing state.

REFERENCE SIGNS LIST

101: vacuum chamber
102, 204: vacuum pumping system
103: sample exchange mechanism
104: charged particle beam source
105, 1705: charged particle beam
106, 1301, 1702: sample
107: secondary signal
108: secondary signal detection system
109: control system
110, 1302, 1701: sample table
111: sample stage
112: image display device
113: ionic liquid introduction mechanism
201: liquid tank
202, 303, 702, 1704: ionic liquid
203: inlet
205: shutter
206: probe rod
207: rough movement mechanism
208: fine movement mechanism
209: probe
301: probe fixing section
302, 1703: hole
401, 501, 704: ionic liquid droplet
402, 502: Si substrate
403: region to be irradiated with electron beam
404, 503: region irradiated with electron beam
701: target position A
703: target position B
1001, 1101, 1201: irradiation region A
1002, 1102, 1202: irradiation region B
1003, 1103, 1203: irradiation region C
1302: sample table
1303: sample exchange rod
1304: sample exchange chamber
1305, 1505: sample rotating rod
1306: sample rotating rod control section
1307: liquid bath
1308: attachment
1309: gate valve
1501: sample rotating rod tip
1502: sample table bottom
1503, 1504: screw groove
1801: ionic liquid

The invention claimed is:

1. A wiring method, comprising:
placing an ionic liquid on a wiring track of a sample to be subjected to wiring, prior to irradiation of the sample using a charged particle beam; and
irradiating the sample having the ionic liquid thereon with the charged particle beam to perform the wiring on the sample, the irradiating of the sample including forming a wiring line by attraction of the ionic liquid to a charged portion of the sample, and
wherein an irradiation position of the charged particle beam is moved along the wiring track.

2. The wiring method according to claim 1, wherein the ionic liquid is dropped on the sample, and the ionic liquid dropped on the sample is irradiated with the charged particle beam.

3. A wiring method, comprising:
placing an ionic liquid at a first position on a sample table to be subject to wiring and a sample at a second position on the sample table, the ionic liquid and the sample being apart from each other;
irradiating the ionic liquid with a charged particle beam to perform wiring on the sample table; and
forming a wiring line by moving an irradiation position of the charged particle beam moved from the first position where the ionic liquid is placed to the second position where the sample is placed.

4. The method according to claim 1, wherein the ionic liquid is at a first position on the sample, and the irradiation position of the charged particle beam is moved along the wiring track from the ionic liquid at the first position to a target position on the sample, the first position and the target position being apart from each other.

5. The method according to claim 1, wherein the irradiating of the sample includes irradiating the wiring track having the ionic liquid thereon.

6. The method according to claim 1, wherein the irradiation position is sequentially moved along the wiring track as time passes.

7. The method according to claim 1, wherein the irradiation position is moved so that one irradiation position and a subsequently irradiated irradiation position overlap with each other.

8. The method according to claim 1, wherein the irradiation position of the charged particle beam is moved along the wiring track using a deflector.

9. The method according to claim 3, wherein the forming of the wiring line is caused by attraction of the ionic liquid to a charged portion of the sample.

10. The method according to claim 3, wherein
the ionic liquid at the first position is a first ionic liquid supply, and
the method further comprises:
placing a second ionic liquid supply at the second position where the sample is placed, the second ionic liquid supply being smaller than the first ionic liquid supply.

11. The method according to claim 3, wherein the forming of the wiring line includes moving the sample table, using a sample stage coupled to the sample table, so that the irradiation position of the charged particle beam is moved along a wiring track of the sample table.

12. The method according to claim 3, wherein the ionic liquid is placed in an ionic liquid holding member of the sample table.

13. The method according to claim 3, wherein the irradiation position is sequentially moved along a wiring track of the sample table as time passes.

14. The method according to claim 3, wherein the irradiation position is moved so that one irradiation position and a subsequently irradiated irradiation position overlap with each other.

\* \* \* \* \*